United States Patent
Ker et al.

(10) Patent No.: US 6,657,835 B2
(45) Date of Patent: Dec. 2, 2003

(54) ESD PROTECTION CIRCUIT FOR MIXED-VOLTAGE I/O BY USING STACKED NMOS TRANSISTORS WITH SUBSTRATE TRIGGERING TECHNIQUE

(75) Inventors: Ming-Dou Ker, Hsin Chu (TW); Chien-Hui Chuang, Taipei (TW); Wen-Yu Lo, Taichung (TW)

(73) Assignee: Silicon Integrated Systems Corp., Hsin-chu (TW)

( * ) Notice: Subject to any disclaimer, the term of this patent is extended or adjusted under 35 U.S.C. 154(b) by 208 days.

(21) Appl. No.: 09/874,996

(22) Filed: Jun. 7, 2001

(65) Prior Publication Data

US 2002/0159208 A1 Oct. 31, 2002

(51) Int. Cl.[7] .................................................. H02H 9/00
(52) U.S. Cl. .......................... 361/56; 361/111; 361/117
(58) Field of Search ............................ 361/56, 111, 117

(56) References Cited

U.S. PATENT DOCUMENTS

| | | |
|---|---|---|
| 5,932,918 A | 8/1999 | Krakauer |
| 6,140,682 A * | 10/2000 | Liu et al. .................... 257/355 |
| 6,433,979 B1 * | 8/2002 | Yu ............................... 361/56 |

OTHER PUBLICATIONS

Ming–Dou Ker et al., "ESD Protection Design for Mixed–Voltage I/O Circuit with Substrate–Triggered Technique in Sub–Quarter–Micron CMOS Process", Proceedings of the International Symposium on Quality Electronic Design, 2002, IEEE.

* cited by examiner

Primary Examiner—Gregory J. Toatley, Jr.
Assistant Examiner—Isabel Rodriguez
(74) Attorney, Agent, or Firm—Birch, Stewart, Kolasch & Birch, LLP

(57) ABSTRACT

An ESD protection circuit for Mixed-Voltage I/O by using stacked NMOS transistors with substrate triggering technique is disclosed. The ESD protection circuit contains a set of stacked NMOS transistors with a first NMOS transistor and a second NMOS transistor, a parasitic lateral bipolar transistor, a substrate current generating circuit, and a parasitic substrate resistor. The drain of the first NMOS transistor connects to an I/O pad. The gate of the first NMOS transistor connects to a first working voltage. The source of the first NMOS transistor connects to the drain of the second NMOS transistor. The gate of the second NMOS transistor connects to an internal circuit. The source of the second NMOS transistor connects to a second working voltage. The collector of the parasitic lateral bipolar transistor connects to the drain of the first NMOS transistor and its emitter connects to the source of the second NMOS transistor. A first terminal of the substrate current generating circuit connects to the I/O pad, a second terminal connects to the second working voltage, and a third terminal connects to the substrate of the lateral bipolar transistor, so that a triggering current is sent out of the third terminal when the voltage at the I/O pad is over a predetermined value. One end of the parasitic substrate resistor connects to the base of the bipolar transistor and the other end connects to the second working voltage, using the triggering current to generate a bias for the bipolar transistor. During ESD-stress condition, such ESD protection circuit can be quickly triggered on to discharge ESD current. During IC normal circuit operating condition, such ESD protection circuit is kept off.

12 Claims, 8 Drawing Sheets

(1) PS-MODE (2) NS-MODE (3) PD-MODE (4) ND-MODE

ESD PROTECTION CIRCUIT FOR MIXED-VOLTAGE I/O BY USING STACKED NMOS TRANSISTORS WITH SUBSTRATE TRIGGERING TECHNIQUE

BACKGROUND OF THE INVENTION

1. Field of Invention

The invention relates to an ESD (Electrostatic Discharge) protection circuit and, in particular, to an ESD protection circuit for mixed-voltage I/O by using stacked NMOS transistors with the substrate triggering technique.

2. Related Art

To construct a high circuit density and to achieve desired functions, MOSFETs (Metal Oxide Semiconductor Field Effect Transistor) with shrinking dimensions have been widely used in advanced IC (Integrated Circuit) techniques. However, to satisfy the requirement of a constant field scaling, many IC techniques also scale down the power supply voltage. Therefore, an interface is required to connect semiconductors or sub-systems using different internal working voltages. Due to the mixed working voltages, the chip-to-chip interface I/O circuit must be designed to prevent electrical overstress and undesirable current leakage paths. The ESD circuit also has to satisfy similar conditions and constraints. One of the constraints is that the mixed-voltage I/O circuit is able to sustain voltages, which may be in excess of the gate oxide reliability requirement.

FIG. 1 shows an embodiment of the U.S. Pat. No. 5,932,918 "ESD protection clamp for mixed voltage I/O stages using NMOS transistors". As shown in the drawing, the patent proposed to use stacked NMOS transistors 122, 126 to limit the voltage on the I/O pad, protecting the internal circuit. The implementation of the stacked NMOS transistors 122, 126 in CMOS manufacturing process is shown in FIG. 2. The source of the transistor 122 and the drain of the transistor 126 share an intermediate N+ diffusion region. In such a structure, there is a parasitic lateral bipolar transistor. FIG. 3 is a voltage-current breakdown characteristics of a single NMOS device and stacked NMOS devices. As shown in the drawing, the working voltages of the stacked NMOS transistors 122, 126 in the breakdown region are almost twice as big as that of a single NMOS transistor. When the same ESD current flows through the stacked transistors, heat generated on the stacked NMOS transistors (Power=I * V) doubles that of a usual single NMOS device. Therefore, the stacked NMOS transistors are easily to-be burned out due to the ESD. In other words, the ESD robustness of the stacked NMOS devices is greatly decreased.

SUMMARY OF THE INVENTION

In view of the foregoing problems, an object of the invention is to provide an ESD protection circuit for mixed-voltage I/O by using stacked NMOS transistors with the substrate triggering technique to increase ESD protection capability for mixed-voltage I/O circuits.

The disclosed ESD protection circuit uses the substrate triggering technique to perform ESD protection on mixed-voltage I/O circuits. The ESD protection circuit contains: a set of stacked NMOS transistors with a first NMOS transistor and a second NMOS transistor, a parasitic lateral bipolar transistor, a substrate current generating circuit, and a parasitic substrate resistor. The drain of the first NMOS transistor connects to an I/O pad. The gate of the first NMOS transistor connects to a first working voltage. The source of the first NMOS transistor connects to the drain of the second NMOS transistor. The gate of the second NMOS transistor connects to an internal circuit. The source of the second NMOS transistor connects to a second working voltage. The collector of the parasitic lateral bipolar transistor connects to the drain of the first NMOS transistor and its emitter connects to the source of the second NMOS transistor. A first terminal of the substrate current generating circuit connects to the I/O pad, a second terminal connects to the second working voltage, and a third terminal connects to the substrate of the lateral bipolar transistor, so that a triggering current is sent out of the third terminal when the voltage at the I/O pad is over a predetermined value. One end of the parasitic substrate resistor connects to the base of the bipolar transistor and the other end connects to the second working voltage, using the triggering current to turn on the bipolar transistor.

DETAILED DESCRIPTION OF THE INVENTION

The present invention will be apparent from the following detailed description, which proceeds with reference to the accompanying drawings, wherein the same references relate to the same elements.

Figure 1:
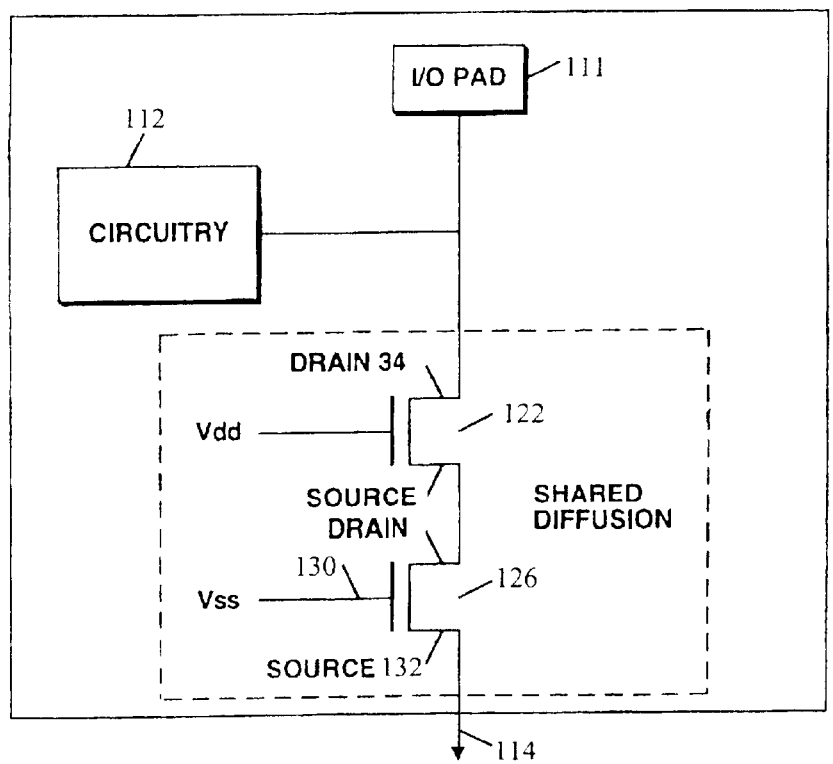
FIG. 1 is a conventional ESD protection circuit of the mixed-voltage I/O pad.
Figure 2:
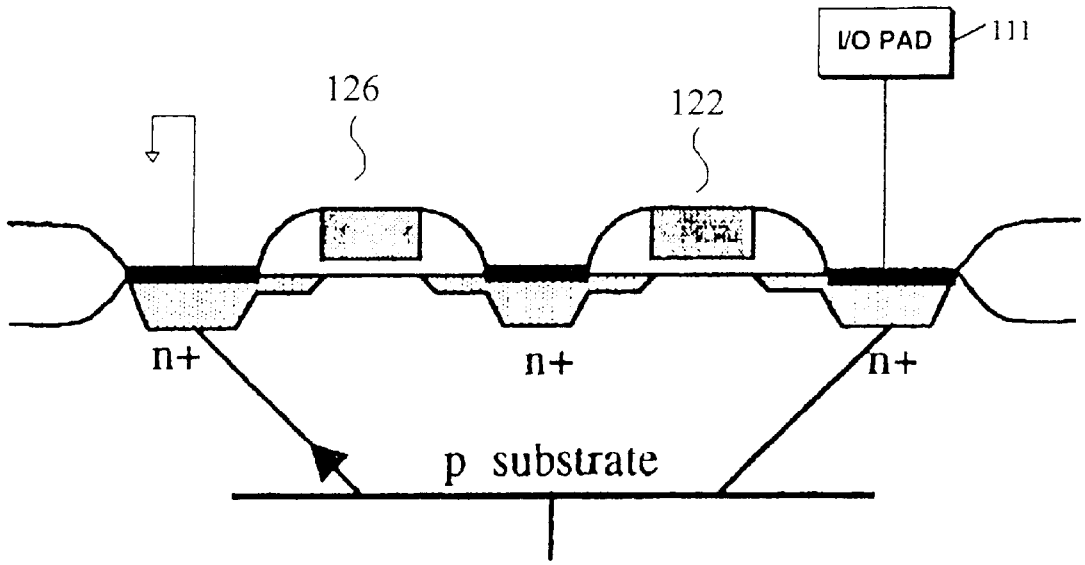
FIG. 2 is a cross-sectional view of stacked NMOS in FIG. 1.
Figure 3:
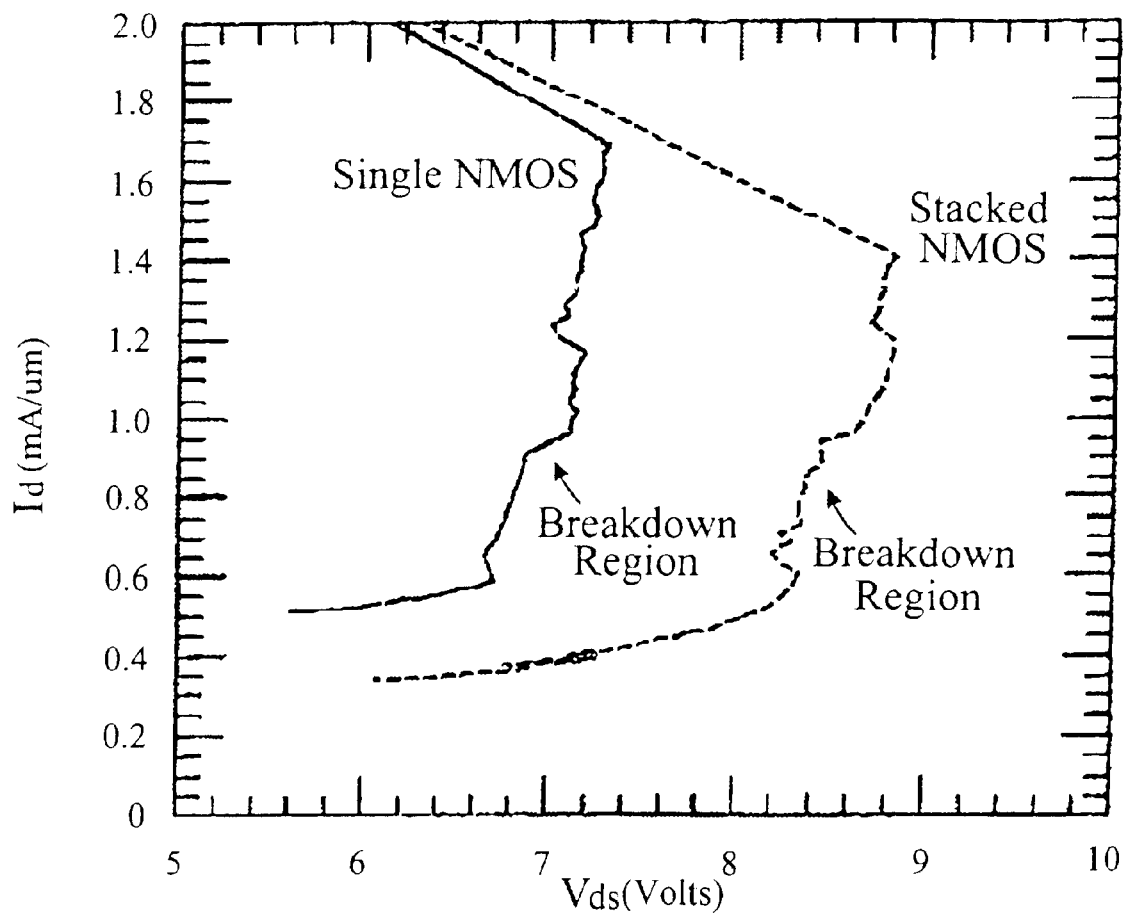
FIG. 3 shows the relation between the drain and source voltage and the drain current on the stacked NMOS or single NMOS.
Figure 4:
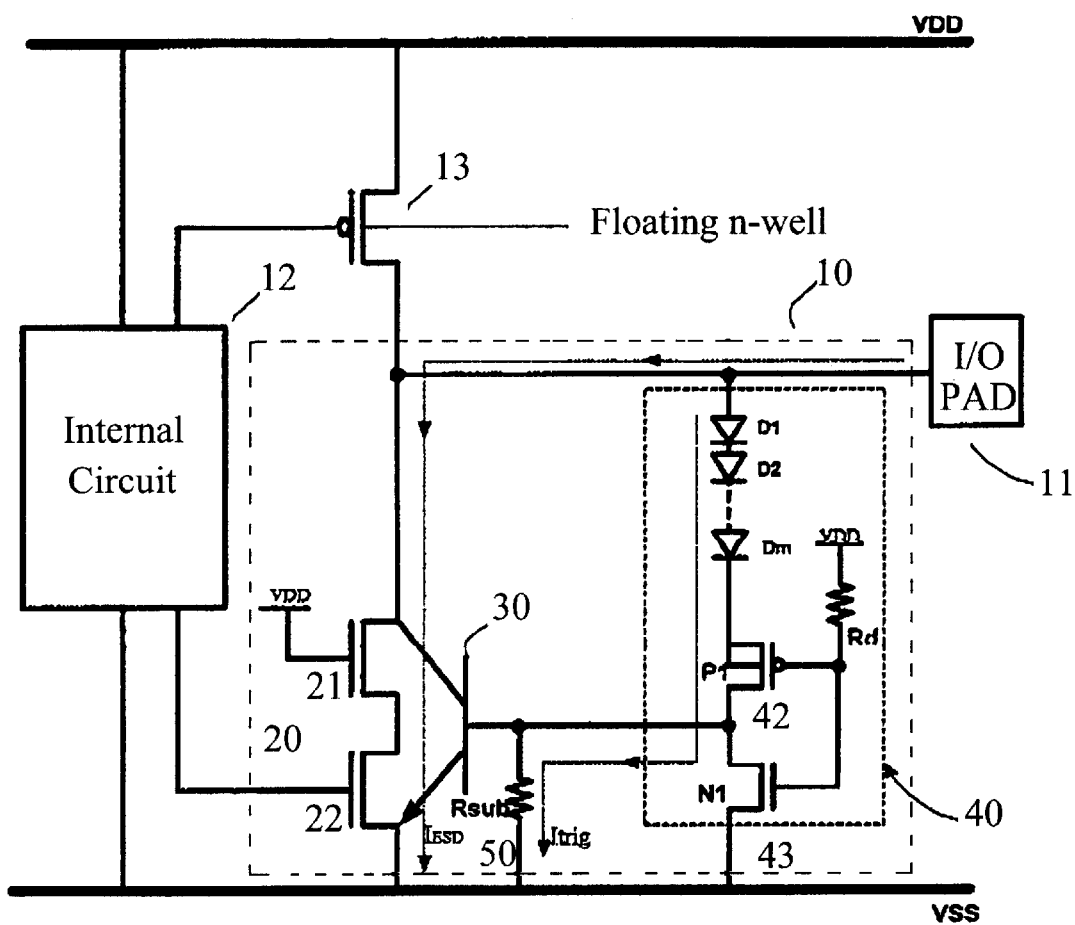
FIG. 4 shows a first embodiment of the disclosed ESD protection circuit.

As shown in FIG. 4, the disclosed ESD (Electrostatic Discharge) protection circuit 10 includes a stacked NMOS transistor 20, a lateral bipolar transistor 30, a parasitic substrate resistor Rsub 50, and a substrate current generating circuit 40. The stacked NMOS transistor 20 limits the voltage at the I/O pad within a predetermined voltage range. The substrate current generating circuit 40 generates a triggering current Itrig. When Itrig is grater than a threshold current, a voltage produced by the parasitic substrate resistor trigger the lateral bipolar transistor 30 in advance so as to shunt the ESD current, whereby enhancing the ESD tolerance of the protection circuit.

The stacked NMOS transistor 20 contains a top NMOS transistor 21 and a bottom NMOS transistor 22. For the top transistor 21, the drain connects to an I/O pad 11 and the gate connects to a first working voltage Vdd. For the bottom transistor 22, the drain connects to the source of the top transistor 21, the gate connects to an internal circuit 12, and the source connects to a second working voltage Vss, namely, the electrical ground. It should be noted that the source of the top transistor 21 and the drain of the bottom transistor 22 also form a shared diffusion region. Furthermore, the gate of the bottom transistor connects to the internal circuit, not the second working voltage Vss.

The collector electrode of the bipolar transistor 30 connects to the drain of the top transistor 21, i.e. the I/O pad 11. The emitter electrode of the bipolar transistor 30 connects to the source of the bottom transistor 22, i.e. the second working voltage Vss. The parasitic substrate resistor Rsub 50 connects to the base electrode between the bipolar transistor 30 and the second working voltage Vss. Therefore, when the triggering current Itrig is greater than a threshold value, namely, the bias at the base-emitter junction of the bipolar transistor 30, the bipolar transistor 30 becomes conducting, whereby shunting the ESD current from the I/O pad 11 to the second working voltage Vss, the ground.

The substrate current generating circuit 40 generates the triggering current Itrig. As shown in FIG. 4, the substrate current generating circuit 40 contains a diode string D1-D2-...-Dm, a PMOS transistor 42, an NMOS transistor 43, and a resistor Rd. The positive electrode of the diode string D1-D2-...-Dm connects to the I/O pad II. Its negative electrode connects to a first current electrode of the PMOS transistor 42. The drain of the NMOS transistor 43 connects to a second current electrode of the PMOS transistor 42 and its source to the second working voltage Vss. The gates of the PMOS transistor 42 and the NMOS transistor 43 connects to the first working voltage Vdd through the resistor Rd. The triggering current Itrig flows through the I/O pad 11 and the serial diode D1-D2-...-Dm, and the PMOS transistor 42, to the base of the bipolar transistor 30. The action of the NMOS transistor 43 is to avoid large leakage current that may trigger and turn on the bipolar transistor 30 under normal conditions. The resistor Rd can be an n+ diffusion resistor with a parasitic p-sub/n+ diode. The parasitic p-sub/n+ diode can be an antenna diode, solving the antenna effect during the manufacturing process.

In normal circuit operations, the ESD circuit is kept at a non-conductive state and therefore does not interfere with the voltage level at the I/O pad 11. When the I/O pad 11 acts as an input buffer, the pre-driver circuit (not shown) outputs a "logic 0" to the gate of the bottom transistor 22. Therefore, no leakage current flows through the stacked NMOS transistor 20. The relevant equation of the total voltage drop across the diode string Vstring is:

$$Vstring(I) = mV_D(I) - nV_T\left[\frac{m(m-1)}{2}\right] \times \ln(\beta + 1), \quad (1)$$

where m is the number of diodes in the string, n is the ideality factor, and β is the beta gain of the parasitic PNP transistor.

When the voltage at the I/O pad Vpad is greater than Vstring+|Vtp|+Vdd, the substrate current generating circuit 40 produces a triggering current Itrig. The substrate current generating circuit 40 can adjust the length of the diode string D1-D2-...-Dm according to the desired leakage current at the work temperature and the voltage for the substrate current generating circuit 40. This can maintain the ESD circuit at the non-conductive state under normal operations.

Figure 5:
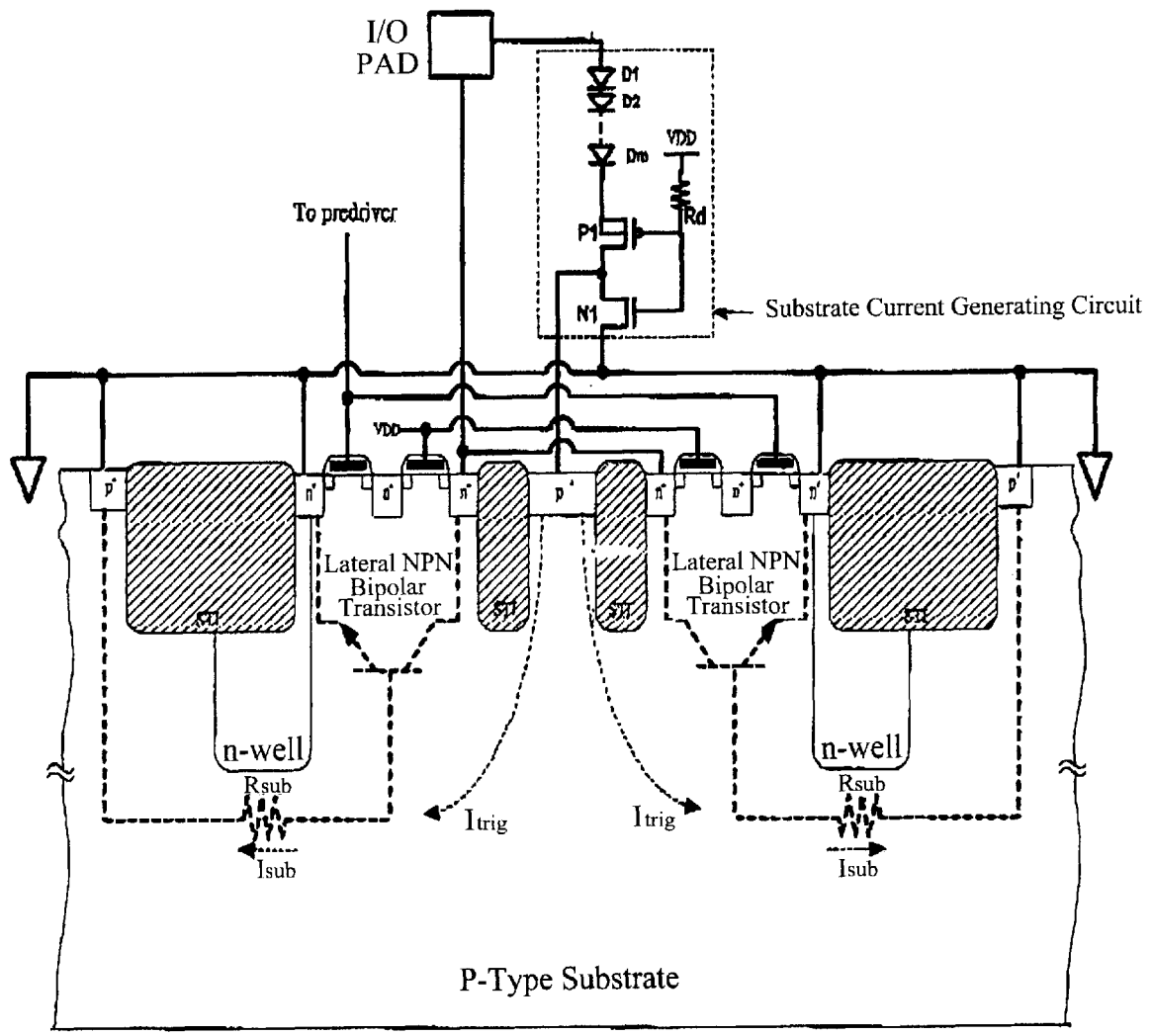
FIG. 5 shows a cross-sectional view of the stacked NMOS transistor structure with a substrate current generating circuit used in a mixed-voltage ESD protection circuit according to the invention.

When ESD happens, the decoupling capacitor of the first working voltage Vdd brings the gate of the PMOS transistor 42 close to the second working voltage Vss and thus approximately the ground. When Vpad≧Vstring+|Vtp|, the substrate current generating circuit 40 becomes conductive and the electrical current flows through the diode string D1-D2-...-Dm and the PMOS transistor 42 to the substrate. At an appropriate parasitic substrate resistor Rsub, the voltage drop across the parasitic substrate resistor Vsub is greater than 0.6V, turning on the bipolar transistor 30. FIG. 5 shows a cross-sectional view of the stacked NMOS transistor structure with a substrate current generating circuit used in a mixed-voltage ESD protection circuit according to the invention. The lateral bipolar junction transtor 30 is formed by the N+ diffusion (drain) of the NMOS 21 and the N+ diffusion (source) of the NMOS 22. An n-well is inserted under the source region of NMOS 22 to increase the equivalent Rsub resistance. With a higher resistance of Rsub, the bipolar transistor 30 is turned on earlier to discharge ESD current.

Figure 6:
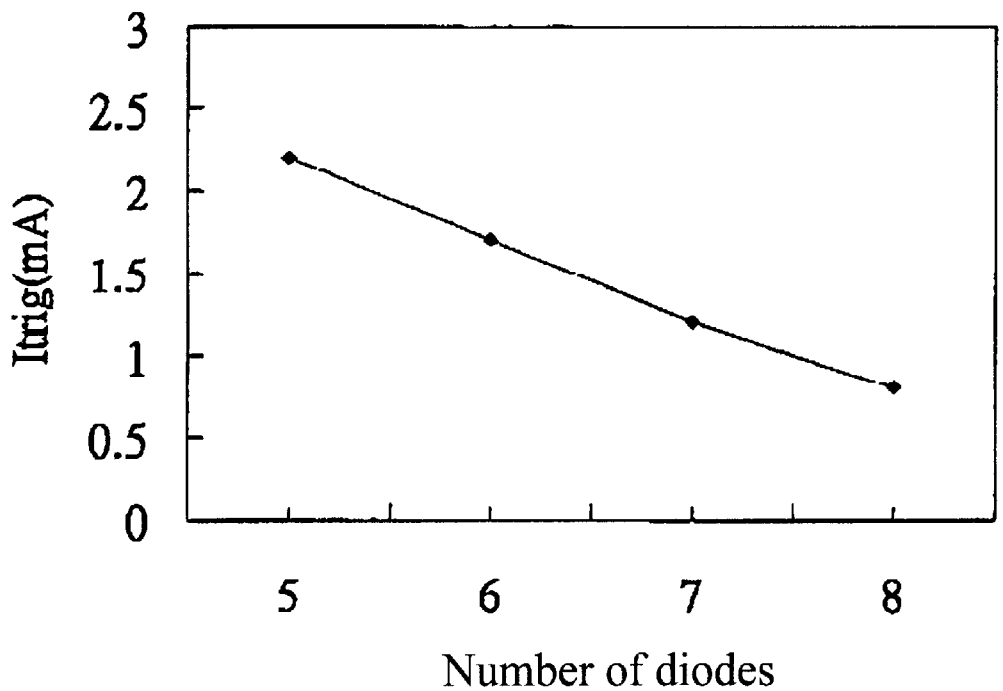
FIG. 6 shows the relation between the number of diodes and the triggering current in SPICE simulation.
Figure 7:
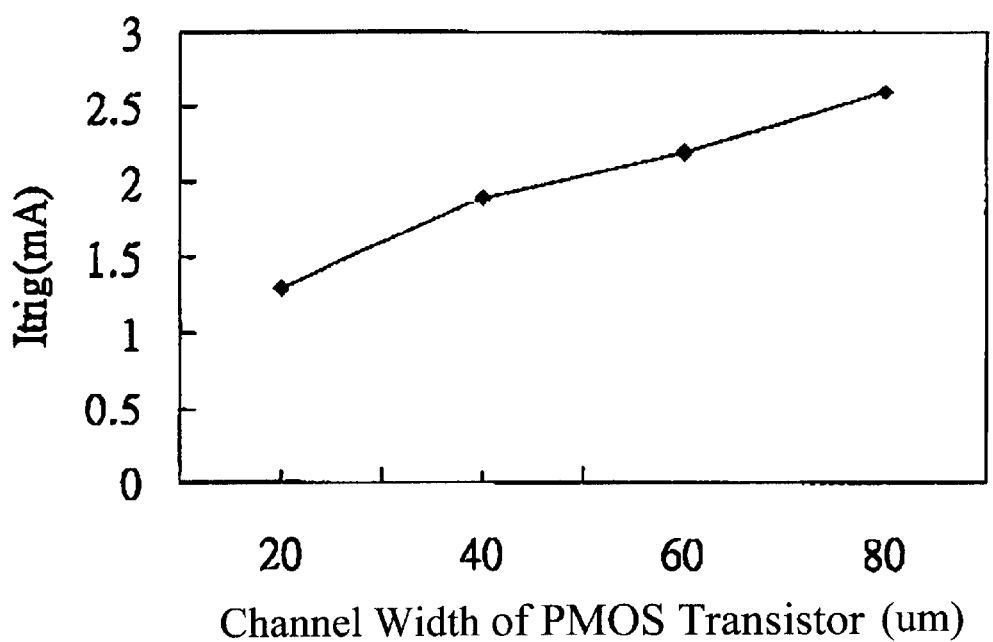
FIG. 7 shows the relation between the width of a PMOS transistor and the triggering current in SPICE simulation.

With reference to FIG. 6, a 0V to 8V voltage pulse is used to simulate the ESD event before stacked NMOS break down (the breakdown voltage of the stacked NMOS transistor 20 is about 10V). From the drawing, one can see that the number of diodes is inversely proportional to the triggering current Itrig. FIG. 7 shows the relation between the channel width of the PMOS transistor 42 and Itrig in SPICE simulation, where the number of diodes is 5 and the channel length of the PMOS transistor 42 is kept at 3 μm. From this drawing, the channel width of the PMOS transistor 42 is proportional to the triggering current Itrig. The number of diodes and the channel width of the PMOS transistor 42 can be adjusted according to the SPICE simulation results shown in FIGS. 6 and 7, so that when ESD happens there is sufficient current Itrig to trigger the parasitic lateral bipolar transistor 30 before the stacked NMOS transistor 20 breaks down.

Figure 8:
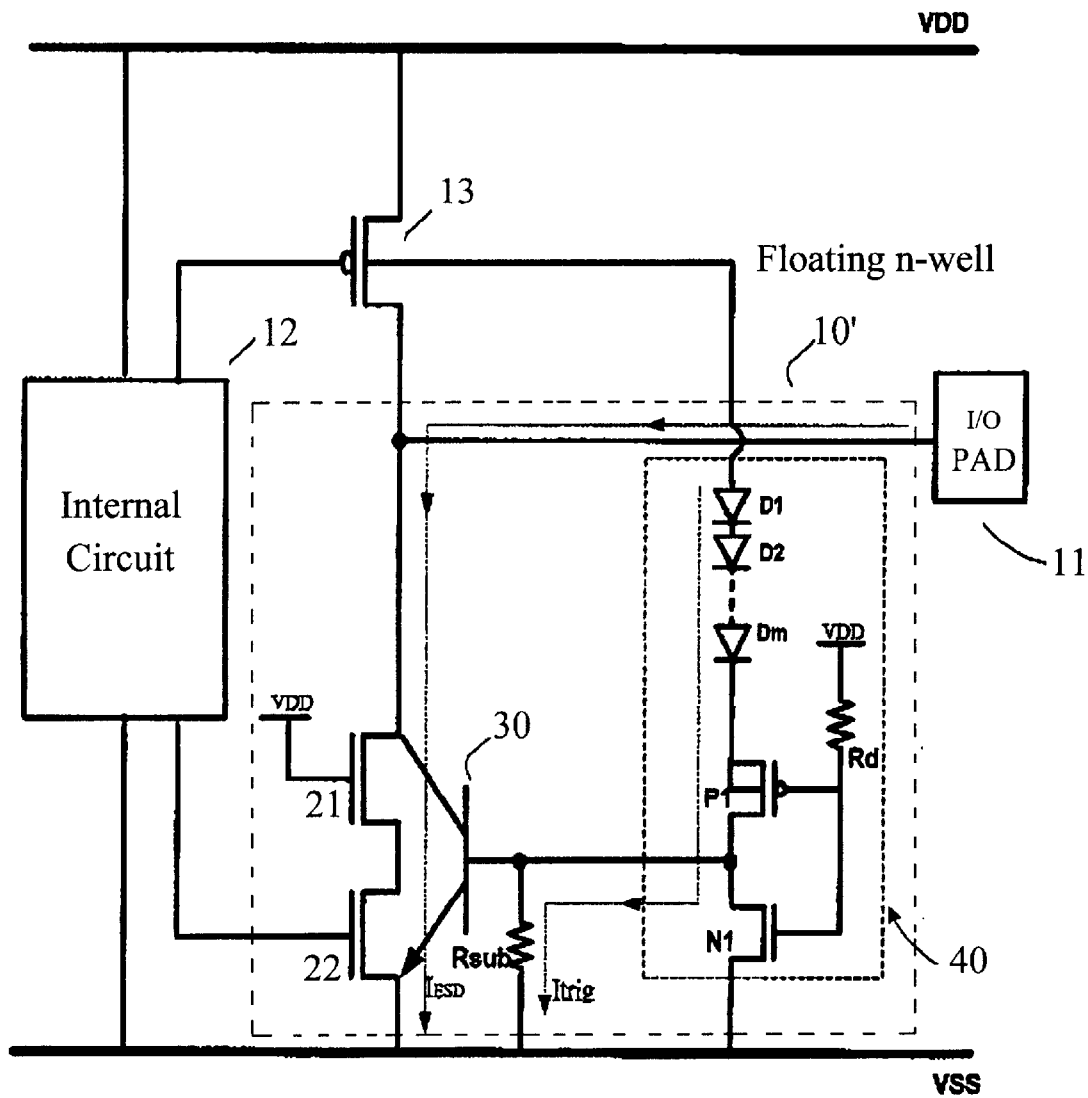
FIG. 8 shows a second embodiment of the disclosed ESD protection circuit.

Referring to FIG. 8, the structure of the ESD protection circuit 10' is similar to that of the first embodiment 10. The only difference is that the positive electrode of the diode string D1-D2-...-Dm is coupled to a floating n-well of a pull-up PMOS transistor 13, which is part of an output buffer. When ESD happens, the current initially flows through the parasitic p+/n− well diode of the pull-up PMOS transistor 13 and the substrate current generating circuit 40 to generate Itrig, quickly turning on the parasitic lateral bipolar transistor 30 contained in the stacked NMOS transistor 20 and shunting the ESD current to the ground. The main purpose of the second embodiment is to provide a clamping configuration to ensure that no additional input capacitance is seen at the I/O pad 1, which is particularly important to analog ICs.

Figure 9:
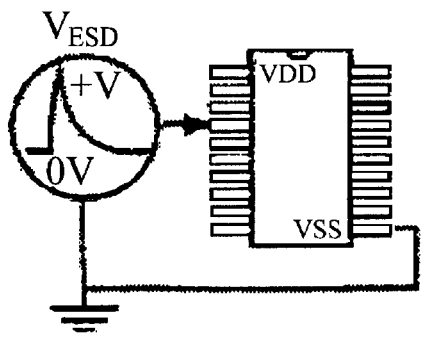
FIG. 9 shows four types of pin combination of ESD testing at an I/O pin.
Figure 9:
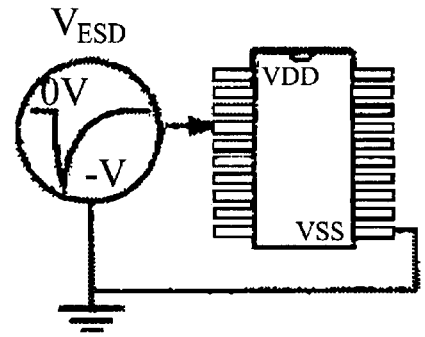
Figure 9:
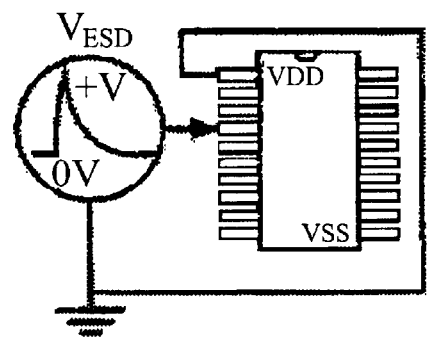
Figure 9:
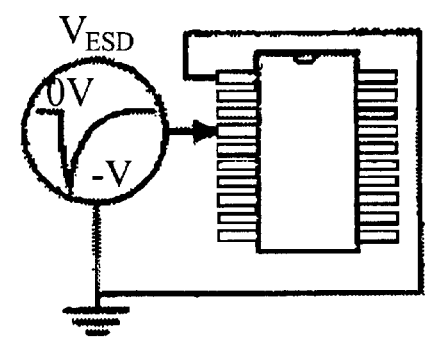
Figure 10:
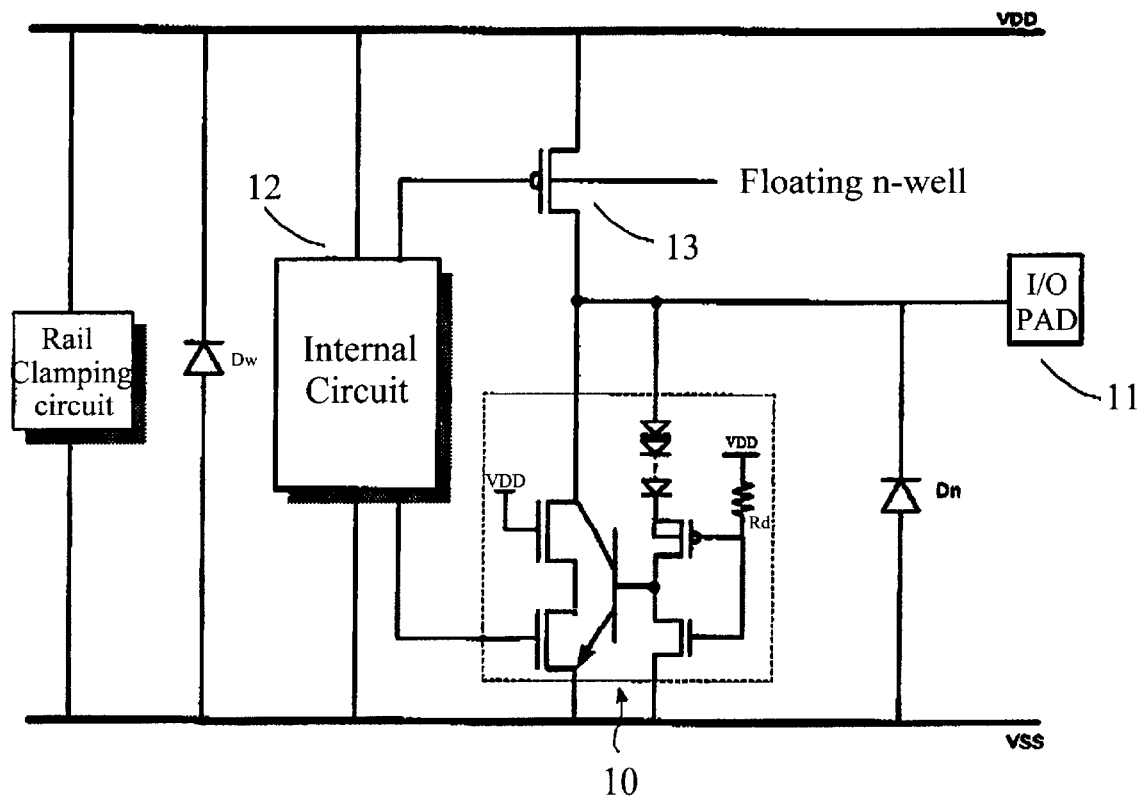
FIG. 10 shows the circuit of the disclosed ESD protection circuit.

With reference to FIG. 9, since the ESD stress may have a positive or negative voltage on the I/O pad 11 with respect to the first working voltage Vdd and/or the second working voltage Vss, there are four different types of the pin combinations of ESD stresses. In these ESD conditions, the ESD voltage is applied to the I/O pad 11 with respect to the first working voltage Vdd or the second working voltage Vss, while other pins are floating. Therefore, the ESD protection circuit has to bypass the ESD current from the input (or output) pins to the Vdd or Vss pins. These four ESD stresses are further described with reference to FIG. 10 as follows:

1. Positive voltage input with respect to Vss: The large positive ESD voltage triggers the substrate current generating circuit 40 and turns on the ESD protection circuit of the stacked NMOS transistor, bypassing ESD current to the second working voltage Vss.

2. Positive voltage input with respect to Vdd: The large positive ESD voltage triggers the substrate current generating circuit 40 and turns on the ESD protection circuit of the stacked NMOS transistor, bypassing ESD current to the second working voltage Vss. At the same time, due to the voltage increase at the second working voltage Vss, a parasitic diode Dw is forced to be conductive, bypassing the ESD current to the first working voltage Vdd, where the parasitic diode Dw is formed from a P-type substrate and an n-well.

3. Negative voltage input with respect to Vss: The large negative ESD voltage makes the parasitic diode Dn conductive, bypassing the ESD current to the second working voltage Vss, where parasitic diode Dn is formed from a P-type substrate and an n+ region.

4. Negative voltage input with respect to Vdd: The large negative ESD voltage makes the parasitic diode Dn conductive, bypassing the ESD current through the parasitic diode Dn and a rail clamping circuit to the first working voltage Vdd.

Therefore, the invention can achieve the ESD protection effectively.

Certain variations would be apparent to those skilled in the art, which variations are considered within the spirit and scope of the claimed invention.

What is claimed is:

1. An ESD protection circuit providing ESD protection for a mixed-voltage I/O circuit using stacked NMOS transistors with the substrate triggering technique comprising:
    a stacked NMOS with a first NMOS and a second NMOS, wherein the drain of the first NMOS is coupled to an I/O pad, the gate of the first NMOS is coupled to a first working voltage, the source of the first NMOS is coupled to the drain of the second NMOS, the gate of the second NMOS is coupled to an internal circuit, and the source of the second NMOS is coupled to a second working voltage;
    a lateral bipolar transistor having a collector and an emitter coupled to the drain of the first NMOS and to the source of the second NMOS, respectively;
    a substrate current generating circuit having a first terminal coupled to the I/O pad, a second terminal coupled to the second working voltage, and a third terminal coupled to the base of the lateral bipolar transistor, so that when the voltage at the I/O pad is over a predetermined threshold, a triggering current is sent out from the third terminal; and
    a substrate resistor having a first terminal coupled to the base of the bipolar transistor and a second terminal coupled to the second working voltage so that the triggering current produces a bias to the bipolar transistor.

2. The ESD protection circuit of claim 1, further comprising a pull-up PMOS having a drain coupled to the I/O pad, a source coupled to the first working voltage, and a gate coupled to the internal circuit.

3. The ESD protection circuit of claim 1, wherein the substrate resistor is a parasitic resistor.

4. The ESD protection circuit of claim 3, wherein a n-well is inserted under the source region of said second NMOS of said stacked NMOS to increase the equivalent resistance of said substrate resistor.

5. The ESD protection circuit of claim 1, wherein the lateral bipolar transistor is a parasitic bipolar transistor.

6. The ESD protection circuit of claim 5, wherein the lateral bipolar transistor is formed by the N+ diffusion (drain) of said first NMOS of said stacked NMOS and the N+ diffusion (source) of said second NMOS of said stacked NMOS.

7. An ESD protection circuit providing ESD protection for a mixed-voltage I/O circuit using stacked NMOS transistors with the substrate triggering technique comprising:
    a stacked NMOS with a first NMOS and a second NMOS, wherein the drain of the first NMOS is coupled to an I/O pad, the gate of the first NMOS is coupled to a first working voltage, the source of the first NMOS is coupled to the drain of the second NMOS, the gate of the second NMOS is coupled to an internal circuit, and the source of the second NMOS is coupled to a second working voltage;
    a lateral bipolar transistor having a collector and an emitter coupled to the drain of the first NMOS and to the source of the second NMOS, respectively;
    a substrate current generating circuit having a first terminal coupled to a floating n-well of a pull-up PMOS transistor, a second terminal coupled to the second working voltage, and a third terminal coupled to the base of the lateral bipolar transistor, so that when the voltage at the I/O pad is over a predetermined threshold a triggering current is sent out from the third terminal; and
    a substrate resistor having a first terminal coupled to the base of the bipolar transistor and a second terminal coupled to the second working voltage so that the triggering current produces a bias to the bipolar transistor.

8. The ESD protection circuit of claim 7 further comprising a pull-up PMOS having a drain coupled to the I/O pad, a source coupled to the first working voltage, and a gate coupled to the internal circuit.

9. The ESD protection circuit of claim 7, wherein the substrate resistor is a parasitic resistor.

10. The ESD protection circuit of claim 9, wherein a n-well is inserted under the source region of said second NMOS of said stacked NMOS to increase the equivalent resistance of said substrate resistor.

11. The ESD protection circuit of claim 7, wherein the lateral bipolar transistor is a parasitic bipolar transistor.

12. The ESD protection circuit of claim 11, wherein the lateral bipolar transistor is formed by the N+ diffusion (drain) of said first NMOS of said stacked NMOS and the N+ diffusion (source) of said second NMOS of said stacked NMOS.

* * * * *